TUNNEL DIODE CIRCUIT USING TRANSISTOR TO BIAS THE TUNNEL DIODE

Filed July 18, 1962 2 Sheets-Sheet 1

INVENTOR
THEODORUS J.VAN KESSEL
BY
Frank R. Trifari
AGENT

Nov. 16, 1965 T. J. VAN KESSEL 3,218,573

TUNNEL DIODE CIRCUIT USING TRANSISTOR TO BIAS THE TUNNEL DIODE

Filed July 18, 1962 2 Sheets-Sheet 2

INVENTOR
THEODORUS J. VAN KESSEL
BY
Frank R. Jifari
AGENT

United States Patent Office 3,218,573

Patented Nov. 16, 1965

3,218,573

TUNNEL DIODE CIRCUIT USING TRANSISTOR TO BIAS THE TUNNEL DIODE

Theodorus Jozef van Kessel, Emmasingel, Eindhoven, Netherlands, assignor to North American Philips Company, Inc., New York, N.Y., a corporation of Delaware Filed July 18, 1962, Ser. No. 210,785

Claims priority, application Netherlands, Aug. 31, 1961, 268,847

7 Claims. (Cl. 331—37)

This invention relates to circuits for producing, amplifying or mixing electrical oscillations with the use of a tunnel diode adjusted to a bias-point on the negative slope part of the current-voltage characteristic curve.

It is known that, because of the form of its static current-voltage curve which exhibits in part a negative slope, a tunnel diode is highly suitable for producing or amplifying electrical oscillations and more particularly high-frequency oscillations. The provision of a supply source for a tunnel diode is difficult, however, since the bias-point of a tunnel diode is at a voltage in the vicinity of, for example, 0.1 volt. This very low voltage results in large energy losses in the series-resistor which has to be connected between the tunnel diode and the supply source, for example, a battery having a terminal voltage of about 1.5 volts. In fact, the voltage drop across the series resistor results in a current through it which is much greater than the current traversing the tunnel diode, since, in order to obtain a stable bias for the tunnel diode, a resistor having a value lower than the absolute value of the differential resistance in the steepest part of the current-voltage curve of the diode must be connected in parallel with the diode. The differential resistance of the tunnel diode is considerably smaller than the actual resistance of the diode at the bias-point, so that the actual resistance is even larger with respect to the parallel resistor, and consequently the current in the parallel resistor is greater than the current through the tunnel diode. Furthermore, large smoothing capacitors are frequently required to prevent parasitic oscillations.

An object of the invention is to overcome these disadvantages and difficulties. According to the invention, the tunnel diode is connected to the emitter of a transistor having the same pass direction as the tunnel diode and is connected, in series with the emitter-collector path of said transistor, to a supply source. The base of the transistor is provided with a low bias as required for the tunnel diode. The transistor may be connected as an amplifier or a generator of electrical oscillations, the output oscillations being applied to an impedance connected to the collector of the transistor.

The invention is based on recognition of the fact that the current-voltage curve (more particularly the emitter current-base voltage curve) of a transistor for a given current may have a steeper slope than has the current-voltage curve of a tunnel diode in the zone of negative slope. Due to the properties of transistors, a resistor connected to the base behaves for a tunnel diode connected to the emitter as a resistance decreased by a factor of $\alpha'$ ($\alpha'$ is the collector-base current gain factor of the transistor). This results in several advantages. First, the tunnel diode may readily be adjusted to a stable bias-point. Second, only a small amount of energy is lost from the supply source due to a fairly high-ohmic resistor being connected parallel to the series-combination of tunnel diode and transistor. Third, the said resistor may be chosen to have a value low enough to obtain the desired slope of the current-voltage curve of the transistor so that this curve has only one point of intersection with the current-voltage curve of the tunnel diode. However, if a resistor were included between the emitter of the transistor and the tunnel diode, the adjustment of the tunnel diode would become unstable, in which case the characteristic curve of the transistor has a reduced slope so that it has three points of intersection with the curve of the tunnel diode.

Including a transistor between the supply source and the tunnel diode affords, in addition, the possibility that the transistor may operate, for example, as an amplifier of electrical oscillations, by including in the collector lead an impedance having a high value for these oscillations.

In order that the invention may be readily carried into effect, it will now be described in detail, by way of example, with reference to the accompanying diagrammatic drawings, in which.

Figure 1:
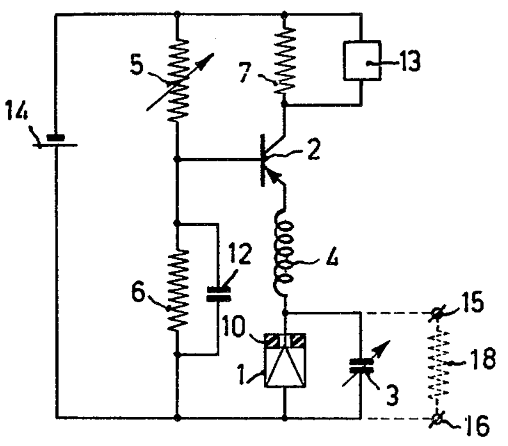
FIGURE 1 shows a circuit according to the invention in which the tunnel diode operates as an oscillator.

In FIGURE 1, a tunnel diode 1 is connected to the emitter of a transistor 2. Tunnel diode 1 has a pass direction equal to that of the transistor 2. The base of transistor 2 is connected to the junction of a resistor 6 and a resistor 5 which form a voltage divider between the terminals of a voltage source 14. By making resistor 5 a variable resistor, the voltage V across the series-combination of tunnel diode 1 and the base-emitter path of transistor 2 may be adjusted to a suitable low value. A coil 4 between the tunnel diode and the emitter and a variable capacitor 3 in parallel with the tunnel diode from a high frequency parallel circuit for the tunnel diode 1, tuned to the desired frequency, since a capacitor 12 in parallel with resistor 6 has a value such as to short-circuit the high frequencies, and the high-frequency base-emitter resistance of transistor 2 is low.

The transistor 2 fulfills the function of an energy amplifier for the high-frequency oscillations produced by the tunnel diode 1 and set up between the base and emitter of transistor 2. These oscillations appear in amplified form across a resistor 7 included in the collector circuit of transistor 2 and are applied to an impedance 13. It has been found efficacious for the tunnel diode 1 to be mechanically coupled directly to a ferrite ring 10 in order to avoid parasitic oscillations in the cm.- and dm.-wave ranges.

Figure 2:
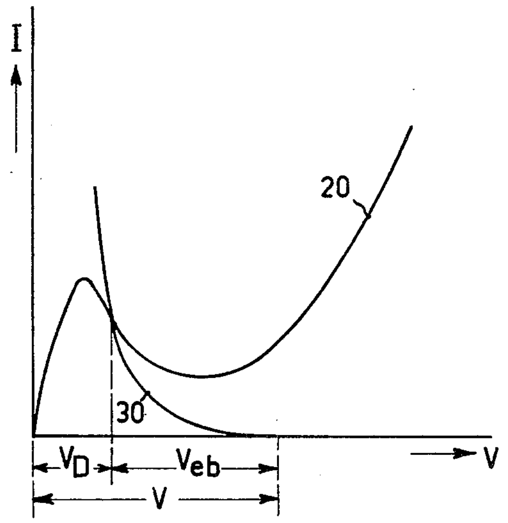
FIGURE 2 shows the current-voltage characteristic curves of the series-combination of tunnel diode and transistor.

FIGURE 2 shows the current-voltage characteristic curves 20 and 30 of tunnel diode 1 and transistor 2 respectively. The voltage V across the series-combination of tunnel diode 1 and the base-emitter path of transistor 2 is adjusted, as previously mentioned, by means of the variable resistor 5. The voltage across the tunnel diode 1 is indicated by $V_D$ and the voltage across the base-emitter path of transistor 2 by $V_{eb}$.

In one embodiment, tunnel diode 1 was a Ge-tunnel diode, transistor 2 a transistor of type OC171; coil 3 and capacitor 4 were, like impedance 13, tuned to a frequency of 80 mc./s; resistors 5 and 6 had values of 25 K ohms and 1 K ohm respectively; the voltage source 14 was 10 volts; the tunnel diode current (emitter current of the transistor) was about 1 ma., whilst $V_D$ was about 0.1 volt and $V_{eb}$ about 0.3 volt.

The tunnel diode 1 may also be circuited as an amplifier by shunting it by a resistor 18 of sufficiently low value, so that the oscillating condition is no longer fulfilled. The signal to be amplified is in this case applied between terminals 15 and 16 and the amplified signal is amplified again by transistor 2 and applied to the impedance 13. In practice, resistor 18 constitutes the internal resistance of the high-frequency signal source.

Figure 3:
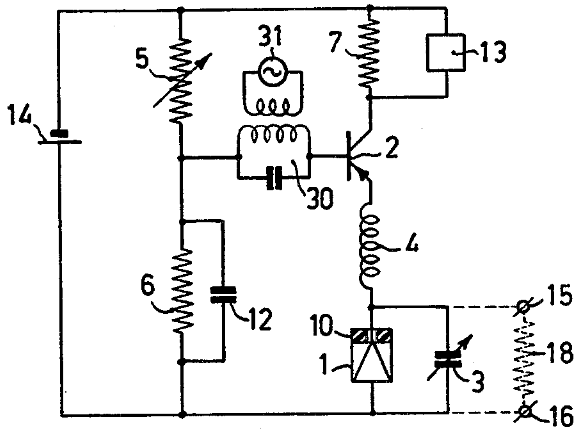
FIGURES 3 and 4 show variations of the circuit according to the invention.

The circuit may also be modified in a simple manner to form a mixing circuit. FIGURE 3 shows a mixing circuit. It differs from the circuit of FIGURE 1 in that a circuit 30 is included between the base of transistor 2 and the junction of resistors 5 and 6. The circuit 30 has applied to it a signal of frequency $f$ from a signal source 31. The coil 3 and capacitor 4 are tuned to a frequency $f_1$. The impedance 13 is tuned to the difference frequency or the sum frequency of $f$ and $f_1$. It is also possible for the impedance 13 to be tuned either to $f$, or to both $f$ and $f_1$. The quality of the collector circuit must then be so high and the distance between the frequencies $f$ and $f_1$ so large that components of the sum-and/or difference frequencies do not occur in the output signal. In the last-mentioned case (13 tuned to $f$ and $f_1$) reflex-amplifier is provided.

Figure 4:
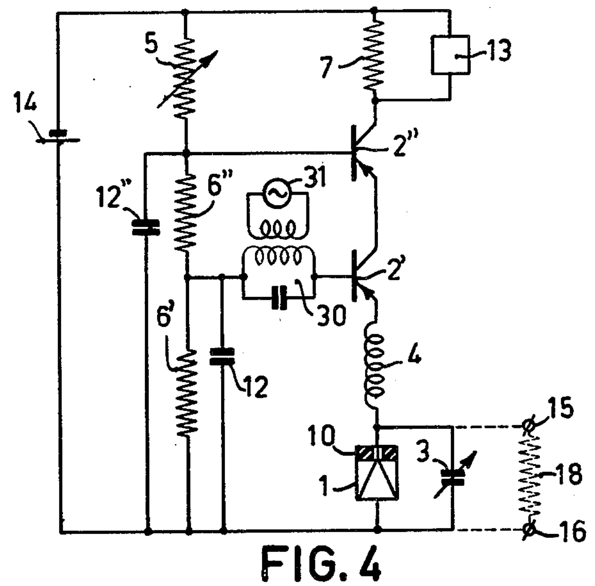

FIGURE 4 shows another mixing circuit in which transistors 2'' and 2' are connected in cascade to obtain better decoupling between the local oscillator 31 and the output circuit 13.

What is claimed is:

1. A circuit for biasing a tunnel diode comprising a tunnel diode, a transistor having emitter, base and collector electrodes, a supply source, first and second resistors connected serially to said source, means connecting the emitter-base path of said transistor and said tunnel diode with the same past direction in series across one of said resistors, whereby said tunnel diode is biased to a negative slope part of its characteristics, means for providing oscillations across said tunnel diode, capacitor means in parallel with said first resistor and having a low impedance with respect to said oscillations, and load circuit means connected to said collector electrode, whereby said oscillations are amplified by said transistor.

2. A circuit for biasing a tunnel diode and amplifying oscillations across said diode comprising a tunnel diode, a transistor having emitter, base and collector electrodes, a source of voltage having first and second terminals, first and second transistor means connected between said first and second terminals in that order, means connecting said diode between said first terminal and said emitter means connecting said base electrode to the junction of said first and second resistors whereby said diode and the emitter-base path of said transistor have the same pass directions and said diode is biased to a negative slope portion of its characteristics, means for providing oscillations across said diode, capacitor means in parallel with said first resistor having a low impedance with respect to said oscillations, and load means connected between said second terminal and said collector electrode.

3. A circuit for biasing a tunnel diode and amplifying oscillations across said diode comprising a tunnel diode, a transistor having emitter, base and collector electrodes, a source of voltage having first and second terminals, first and second resistor means connected between said first and second terminals in that order, a coil, means serially connecting said coil and tunnel diode in that order between said emitter and said first terminal, a first capacitor connected in parallel with said diode, means connecting said base to the junction of said first and second resistors whereby said diode and the emitter-base path of said transistor have the same pass direction and said diode is biased to the negative slope portion of its characteristics, a second capacitor in parallel with said first resistor whereby said coil and first capacitor are effectively in parallel and said tunnel diode oscillates at a frequency substantially determined by said coil and first capacitor, and load means connected between said second terminal and said collector electrode.

4. A circuit for biasing a tunnel diode and amplifying oscillations across said diode comprising a tunnel diode, a transistor having emitter, base and collector electrodes, a source of voltage having first and second terminals, first and second resistor means connected between said first and second terminals in that order, a coil, means serially connecting said coil and tunnel diode in that order between said emitter and said first terminal, a first capacitor connected in parallel with said diode, means connecting said base to the junction of said first and second resistors whereby said diode and the emitter-base path of said transistor have the same pass direction and said diode is biased to the negative slope portion of its characteristics, a low impedance source of oscillation connected in parallel with said diode, a second capacitor connected in parallel with said first resistor and having a low impedance for the oscillations of said source, and load circuit means connected between said second terminal and said collector electrode.

5. A combined tunnel diode and transistor circuit comprising a tunnel diode, a transistor having emitter, base and collector electrodes, a source of operating potential having first and second terminals, first and second resistors connected between said first and second terminals in that order, means connecting said base to the junction of said and second resistors, a coil, means serially connecting said diode and coil in that order between said first terminal and said emitter whereby said diode and the emitter-base path of said transistor have the same pass direction, said resistors having values to bias said tunnel diode to the negative slope portion of its characterisictics, a first capacitor in parallel with said diode, means for providing oscillations across said diode, a second capacitor in parallel with said first resistor having a low impedance for said oscillations, whereby said coil and first capacitor are effectively in parallel, load circuit means and means connecting said load circuit between said collector electrode and said second terminal.

6. The circuit of claim 5, in which said means connecting said base to said junction comprises a source of second oscillations, whererby said second oscillations and said first-mentioned oscillations are mixed in said transistor.

7. The circuit of claim 6, in which said means connecting said load circuit to said transistor comprises a second transistor having an emitter connected to said first-mentioned collector electrode, a collector connected to said load circuit means, and a base electrode connected to a tap on said second resistor.

References Cited by the Examiner

UNITED STATES PATENTS

| | | | |
|---|---|---|---|
| 2,841,703 | 7/1958 | Bopp et al. ------ | 325—442 X |
| 2,978,576 | 4/1961 | Watters ------------ | 325—449 |
| 2,978,578 | 4/1961 | Waring ------------- | 325—451 |
| 3,090,926 | 5/1963 | Engel -------------- | 330—24 |

DAVID G. REDINBAUGH, *Primary Examiner.*